US012451337B2

(12) United States Patent
Shimizu

(10) Patent No.: US 12,451,337 B2
(45) Date of Patent: Oct. 21, 2025

(54) SAMPLE CARTRIDGE CARRIER APPARATUS AND CARRIER BASE

(71) Applicant: JEOL Ltd., Tokyo (JP)

(72) Inventor: Masashi Shimizu, Tokyo (JP)

(73) Assignee: JEOL Ltd., Tokyo (JP)

( * ) Notice: Subject to any disclaimer, the term of this patent is extended or adjusted under 35 U.S.C. 154(b) by 429 days.

(21) Appl. No.: 18/085,310

(22) Filed: Dec. 20, 2022

(65) Prior Publication Data

US 2023/0207287 A1 Jun. 29, 2023

(30) Foreign Application Priority Data

Dec. 23, 2021 (JP) ................................ 2021-209224

(51) Int. Cl.
*H01J 37/32* (2006.01)
*H01J 37/20* (2006.01)

(52) U.S. Cl.
CPC ........ *H01J 37/32724* (2013.01); *H01J 37/20* (2013.01); *H01J 37/32743* (2013.01); *H01J 2237/002* (2013.01); *H01J 2237/2001* (2013.01); *H01J 2237/2007* (2013.01)

(58) Field of Classification Search
CPC ......... H01J 2237/002; H01J 2237/2001; H01J 2237/2007; H01J 37/20; H01J 37/32724; H01J 37/32743
See application file for complete search history.

(56) References Cited

U.S. PATENT DOCUMENTS

| | | | | |
|---|---|---|---|---|
| 9,558,910 | B2 * | 1/2017 | Terada | H01J 37/28 |
| 2015/0137000 | A1 * | 5/2015 | Naruse | H01J 37/20 250/441.11 |
| 2015/0243473 | A1 * | 8/2015 | Price | H01J 37/023 250/442.11 |
| 2020/0273660 | A1 | 8/2020 | Fujimoto et al. | |
| 2021/0098225 | A1 | 4/2021 | Kawamura et al. | |
| 2021/0241992 | A1 * | 8/2021 | Schertel | H01J 37/28 |
| 2021/0313142 | A1 * | 10/2021 | Chiyo | H01J 37/265 |
| 2022/0223369 | A1 * | 7/2022 | Yuasa | H01J 37/185 |
| 2022/0223370 | A1 * | 7/2022 | Yuasa | H01J 37/20 |

FOREIGN PATENT DOCUMENTS

| | | | |
|---|---|---|---|
| EP | 3863039 | A1 | 8/2021 |
| EP | 3901983 | A1 | 10/2021 |
| JP | 201055988 | A | 3/2010 |
| JP | 201588237 | A | 5/2015 |

(Continued)

OTHER PUBLICATIONS

Office Action issued in JP2021209224 on Nov. 7, 2023.
Extended European search report issued in EP22211896.0 on Aug. 1, 2023.

*Primary Examiner* — Saul Rodriguez
*Assistant Examiner* — Brendan P Tighe
(74) *Attorney, Agent, or Firm* — The Webb Law Firm

(57) ABSTRACT

A sample cartridge carrier apparatus is coupled with a focused ion beam processing apparatus (FIB processing apparatus). A guide mechanism is configured to guide a series of movements of a sample cartridge holder to allow a sample cartridge to be held by a carrier base on a sub stage. Sub cooling equipment is configured to cool the sample cartridge via the sub stage. A carrier mechanism carries the carrier base between the sub stage and a main stage.

12 Claims, 14 Drawing Sheets

(56) References Cited

FOREIGN PATENT DOCUMENTS

| | | | |
|---|---|---|---|
| JP | 201784743 | A | 5/2017 |
| JP | 202047449 | A | 3/2020 |
| JP | 2020136233 | A | 8/2020 |
| JP | 202157172 | A | 4/2021 |
| JP | 2021139710 | A | 9/2021 |

* cited by examiner

SAMPLE CARTRIDGE CARRIER APPARATUS AND CARRIER BASE

CROSS REFERENCE TO RELATED APPLICATION

This application claims priority to Japanese Patent Application No. 2021-209224 filed Dec. 23, 2021, the disclosure of which is hereby incorporated by reference in its entirety.

BACKGROUND OF THE DISCLOSURE

Field of the Disclosure

The present disclosure relates to a sample cartridge carrier apparatus and a carrier base, and more particularly to a technique of carrying a sample cartridge while maintaining a sample in a cooled condition.

Description of Related Art

Focused ion beam processing apparatuses (FIB processing apparatuses) typically process a sample to be processed, which may hereinafter be referred to as an original sample or an unprocessed sample, with focused ion beams to thereby create a sample to be observed, which may hereinafter be referred to as a sample or a processed sample. Typically, the created sample is to be observed with a transmission electron microscope (TEM). Some FIB processing apparatuses include a scanning electron microscope (SEM) and are therefore also referred to as FIB/SEM processing observation apparatuses.

When the original sample is a living organism, for example, the original sample is cooled (typically frozen), and processed in its cooled condition. The cooled condition of the sample need to be maintained after the processing and also during subsequent observation of the sample.

Unprocessed samples and processed samples are being currently treated with special equipment including a tank containing a refrigerant such as liquid nitrogen (see FIG. 1 of JP 2021-57172 A, for example). Certain tasks are performed with respect to the sample in the tank. For example, a processed fine sample is placed on a sample cartridge in the tank. During these tasks, the sample may change its condition or may drop or break, which may increase the worker's burden.

Sample cartridge holders for a transmission electron microscope, having a cooling function, are known (see JP 2010-55988 A, for example). The special equipment described above is being used to attach a sample cartridge to such a sample cartridge holder.

JP 2017-84743 A discloses, in FIG. 4, carrying of a sample base. This document, however, nowhere discloses specific carrier equipment and in particular nowhere discloses a mechanism for delivering a sample cartridge between a sample cartridge holder and a sample base.

SUMMARY OF THE DISCLOSURE

In addition to a main stage for sample processing, an auxiliary sub stage may be disposed to transfer the sample cartridge on the sub stage. In this configuration, it is necessary to transfer the sample cartridge with the sample maintained in a cooled condition, and also to carry the sample cartridge between the sub stage and the main stage with the sample maintained in the cooled condition.

An aspect of the disclosure is aimed toward carrying a sample cartridge with a sample maintained in a cooled condition. Another aspect of the disclosure is aimed toward carrying a sample cartridge safely between a sample cartridge holder and a sub stage, and between the sub stage and a main stage.

In accordance with an aspect of the disclosure, a sample cartridge carrier apparatus includes a sub stage disposed away from a main stage, a carrier base configured to be placed on the sub stage, and a carrier mechanism. The carrier base includes a cooler block configured to be cooled via the sub stage and a retainer mechanism disposed in the cooler block. The retainer mechanism is configured to retain a sample cartridge received from a sample cartridge holder. The carrier mechanism is configured to carry the carrier base that retains the sample cartridge between the sub stage and the main stage.

In accordance with another aspect, a carrier base is configured to be carried between a sub stage and a main stage. The carrier base includes a retainer mechanism configured to retain a sample cartridge received from a sample cartridge holder. The retainer mechanism includes a mount face, a lever member including a lever configured to rise and fall, and a lock mechanism configured to restrict rising of the lever with the sample cartridge disposed between the mount face and the lever.

BRIEF DESCRIPTION OF THE DRAWINGS

An embodiment of the present disclosure will be described based on the following figures, wherein.

DESCRIPTION OF NON-LIMITING EMBODIMENTS OF THE DISCLOSURE

Figure 1:
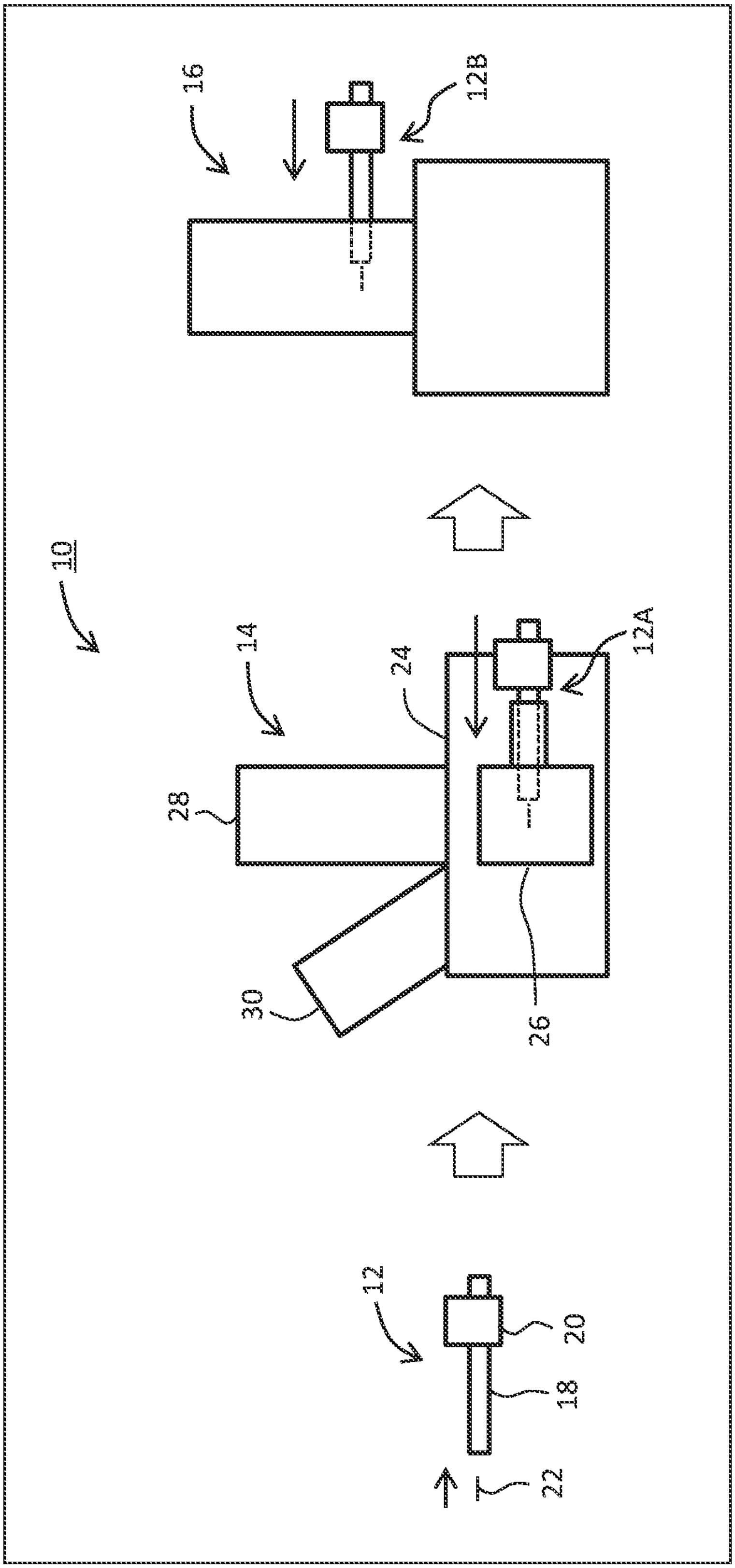
FIG. 1 schematically illustrates a processing observation system according to an embodiment.

An embodiment will be described by reference to the drawings.

(1) Summary of Embodiment

A sample cartridge carrier apparatus according to an embodiment includes a sub stage, a carrier base, and a carrier mechanism. The sub stage is disposed away from the main stage. The carrier base is to be placed on the sub stage, and includes a cooler block to be cooled via the sub stage, and a retainer mechanism disposed in the cooler block. The retainer mechanism retains a sample cartridge received from a sample cartridge holder. The carrier mechanism carries the carrier base holding the sample cartridge between the sub stage and the main stage.

The above configuration allows the sample cartridge to be delivered from the sample cartridge holder to the retainer mechanism and thereby allows the sample cartridge to be integrated with the carrier base or secured to the carrier base. The carrier base is then carried while maintaining this state, which enables safe carriage of the sample cartridge. The carrier base includes the cooler block that accumulates cold energy and is to be cooled via the sub stage. During the carrying process of the carrier base, the cooler block functions as a heat sink to maintain the cooled condition of the sample cartridge directly or indirectly contacting the cooler block and regulate a temperature rise of the sample cartridge.

In the embodiment, the sample cartridge holder is manually operated to thereby operate the retainer mechanism disposed in the carrier base. In other words, the retainer mechanism is operated remotely. This eliminates the need for disposing a driving source for the retainer mechanism on or in the vicinity of the retainer mechanism. The configuration according to the embodiment thus eliminates the need for precise tasks or high level tasks to transfer the sample cartridge between the sample cartridge holder and the carrier base, thereby reducing the burden on users.

In the embodiment, the sample cartridge holder is a portable device that guides an unprocessed sample to the sample cartridge carrier apparatus and carries a processed sample from the sample cartridge carrier apparatus to an observation apparatus. The sample cartridge carrier apparatus is coupled with the processing apparatus including the main stage. The sample cartridge carrier apparatus may be incorporated in the processing apparatus as a portion of the processing apparatus. In the embodiment, the observation apparatus is a transmission electron microscope.

In the embodiment, the processing apparatus includes main cooling equipment that cools the main stage. The sample cartridge holder includes portable cooling equipment that cools the sample cartridge. The sample cartridge carrier apparatus includes sub cooling equipment independently of the main cooling equipment and the portable cooling equipment.

The above configuration maintains the sample cooled condition from the sample processing process through the sample observation process. In particular, the sub cooling equipment that is specific to the sample cartridge carrier apparatus enables stable and effective cooling of the sample cartridge.

In the embodiment, the sample cartridge holder includes a holder body having a tip end that holds the sample cartridge. The sample cartridge carrier apparatus includes a guide mechanism that receives the holder body and guides the tip end toward the carrier base. This configuration facilitates treating of the sample cartridge holder and enables reliable and safe delivery of the sample cartridge to the carrier base.

In the embodiment, the guide mechanism guides the holder body in a first direction. The carrier mechanism carries the carrier base in a second direction orthogonal to the first direction. The first direction and the second direction being orthogonal to each other results in avoidance of physical interference between the carrier mechanism and the sample cartridge holder, and also results in simplification of the configuration of the sample cartridge carrier apparatus.

In the embodiment, the guide mechanism guides a series of movements of the holder body, including a forward movement, a rotation movement, and a backward movement. The retainer mechanism operates in accordance with a change in the position and orientation of the sample cartridge caused by the series of movements. The retainer mechanism configured to perform only the forward movement and the backward movement may have a complicated configuration. The rotation movement of the holder body, and more specifically the rotation movement of the sample cartridge, facilitates remote operation of movable members included in the retainer mechanism.

In the embodiment, the sample cartridge includes a cartridge body and a rear end that is continuous to the cartridge body. The retainer mechanism includes a mount face and a lever member including a lever. The lever is sequentially placed in a floating state and a fallen state in accordance with a change in the position and orientation of the sample cartridge. In the floating state, the cartridge body passes under the lever, and in the fallen state, the sample cartridge is disposed between the mount face and the lever.

In the embodiment, the cartridge body includes a first portion configured to hold a first member including an unprocessed sample and a second portion configured to hold a second member including a processed sample, and the lever in the fallen state holds the rear end.

In the embodiment, the forward movement includes a first forward movement and a second forward movement, and the rotation movement includes a positive rotation movement and a counter rotation movement. The series of movements includes, on a time sequence basis, a first forward movement, a positive rotation movement, a second forward movement, a counter rotation movement, and a backward movement. The sample cartridge is placed in an inclined orientation after the positive rotation movement. During the second forward movement, a corner portion of the sample cartridge is brought into contact with the lever to place the lever in the floating state, and subsequently, a protrusion of the sample cartridge passes under the lever. After the counter rotation movement, the sample cartridge is placed in a horizontal orientation to bring a bottom face of the sample cartridge into contact with the mount face. During the backward movement, the protrusion is brought into contact with the lever, allowing the sample cartridge to be removed from the tip end.

In the embodiment, the carrier base includes a slope face that guides the bottom face of the sample cartridge in the inclined orientation.

In the embodiment, the retainer mechanism includes a member configured to support the lever member to allow the lever member to rotate and move forward and backward, and a lock mechanism configured to restrict the rotation of the lever member. The lock mechanism includes a first engagement portion and a second engagement portion disposed on the lever member. The second engagement portion is configured to engage the first engagement portion by the backward movement of the lever member with the lever being in the fallen state. During the backward movement of the sample cartridge holder, the sample cartridge is removed and the lock state is established. The first engagement portion is an upwardly-facing slope face that is fixed, for example, and the second engagement portion is a slope face facing diagonally upward that is formed on the lever member, for example.

In the embodiment, the retainer mechanism includes an elastic member configured to impart a backward force to the sample cartridge. This configuration reliably maintains the lock state to thereby effective prevent the sample cartridge from shifting on the carrier base and from dropping off the carrier base.

In accordance with another aspect, a carrier base is configured to be carried between a sub stage and a main stage. The carrier base includes a retainer mechanism configured to retain a sample cartridge received from a sample cartridge holder. The retainer mechanism includes a mount face, a lever member, and a lock mechanism. The lever member includes a lever configured to rise and fall. The lock mechanism is configured to restrict rising of the lever with the sample cartridge disposed between the mount face and the lever.

The main stage is a stage for processing and the sub stage is an auxiliary stage, for example. The sub stage may be disposed within a sample processing chamber. In the sample processing chamber, a coating may be applied to the sample. The carrier base includes a carrier base body including a retainer mechanism. The carrier base body is a cooler block or a metal block, for example. The carrier base is used to carry the sample cartridge while maintaining the sample in a cooled state. The carrier base may also be used for other purposes.

(2) Details of Embodiment

FIG. 1 illustrates a processing observation system 10 according to an embodiment. The processing observation system 10 processes an unprocessed sample that is a sample before processing, or an original sample, and observes a processed sample that is a sample after processing. The original sample is an animal tissue or a plant tissue, for example. The original sample in a frozen condition is processed, and the processed sample in its frozen condition is observed. The original sample is also referred to as a bulk sample.

In the illustrated example, the processing observation system 10 includes a sample cartridge holder 12, a processing system 14, and an observation apparatus 16. The sample cartridge holder 12 carries a sample cartridge 22 that holds a carrier on which a sample is placed or to which a sample is fixed. The carrier is a member that may also be referred to a dish, a disk, a grid, or a mesh, for example. In practice, the sample cartridge 22 includes a first portion that holds a carrier having an unprocessed sample and a second portion that holds a carrier having a processed sample.

The sample cartridge holder 12 includes a holder body 18 and a refrigerant tank 20. The refrigerant tank 20 contains a refrigerant, such as liquid nitrogen. The sample cartridge holder 12 includes cooling equipment including the refrigerant tank 20 to maintain the cooled condition of the sample during delivery of the sample. The holder body 18 has a substantially rod shape and holds the sample cartridge 22 at its tip end.

The processing system 14 includes an FIB processing apparatus 24 and a sample cartridge carrier apparatus 26 coupled to the FIB processing apparatus 24. The sample cartridge carrier apparatus 26 may be part of the FIB processing apparatus 24.

The FIB processing apparatus 24 includes a scanning electron microscope. Specifically, the FIB processing apparatus 24 includes an SEM lens barrel 28 and an FIB lens barrel 30 and is therefore an FIB/SEM processing observation apparatus. A sample is processed with focused ion beams (FIB), and an unprocessed sample, a sample under processing, and a processed sample are observed with electron beams. The FIB processing apparatus 24 includes main cooling equipment.

The sample cartridge carrier apparatus 26 carries the sample cartridge 22 between a sample cartridge holder 12A and the FIB processing apparatus 24. The sample cartridge carrier apparatus 26 has a function to apply coating to the sample. In this regard, the sample cartridge carrier apparatus 26 is a sample processing apparatus. The sample cartridge carrier apparatus 26 includes sub cooling equipment. The configuration of the sample cartridge carrier apparatus 26 will be described in detail below.

In the illustrated example, the observation apparatus 16 is a transmission electron microscope. A sample cartridge holder 12B is coupled with the observation apparatus 16 and the processed sample held by the sample cartridge 12B is observed. The observation apparatus 16 includes cooling equipment to maintain the cooled condition of the sample.

Figure 2:
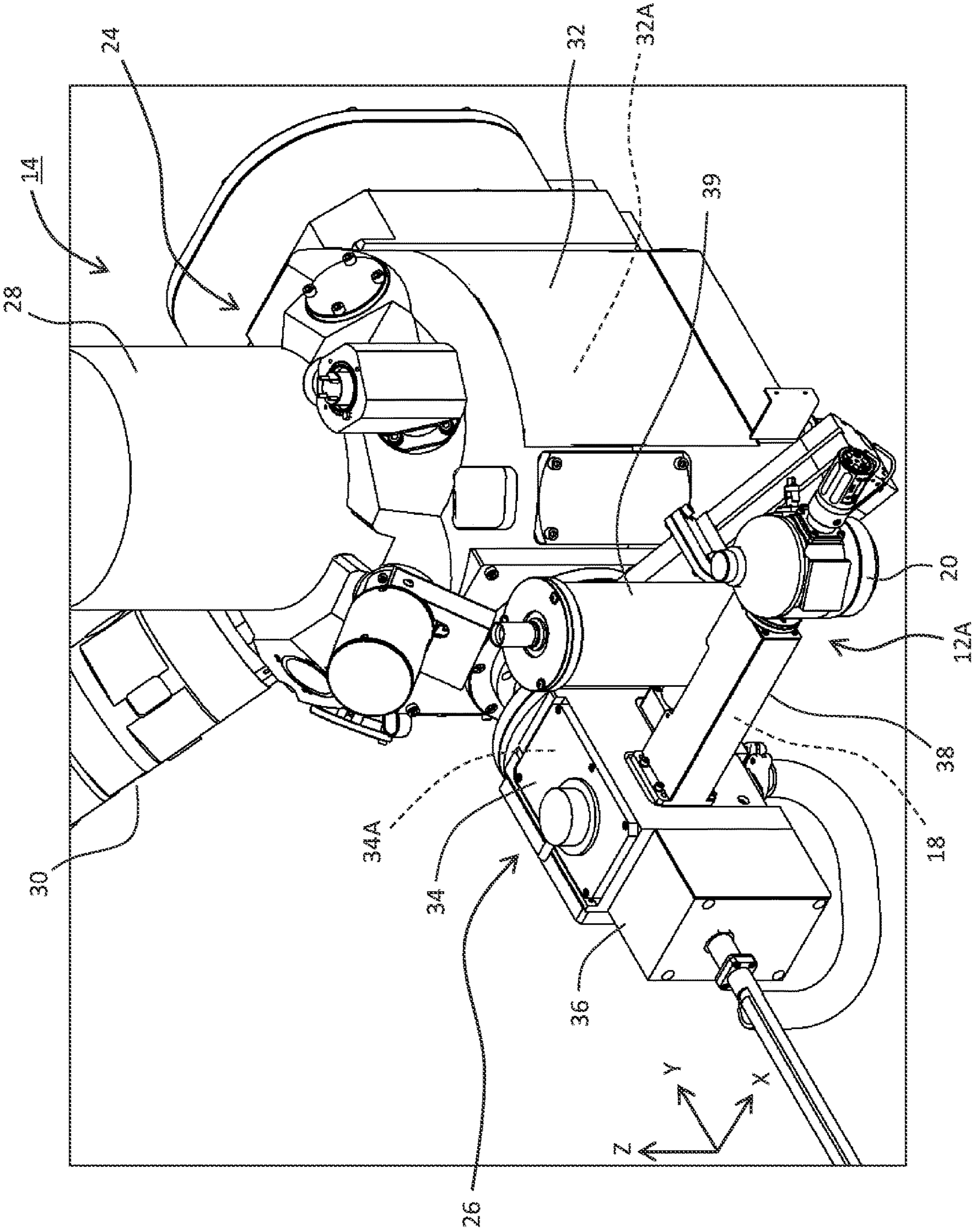
FIG. 2 is a perspective view illustrating a sample cartridge carrier apparatus according to an embodiment.

FIG. 2 illustrates an outer appearance of the sample cartridge carrier apparatus 26 according to the embodiment. The sample cartridge carrier apparatus 26 is coupled with the FIB processing apparatus 24. As described above, the FIB processing apparatus 24 includes the SEM lens barrel 28 and the FIB lens barrel 30. The FIB processing apparatus 24 has a housing 32 as a casing, and a first chamber 32A within the housing 32. The housing 32 includes a port to which the sample cartridge carrier apparatus 26 is coupled.

The sample cartridge carrier apparatus 26 has a box-shape housing 34 and a second chamber 34A within the housing 34. The first chamber 32A and the second chamber 34A communicate with each other. The sample cartridge carrier apparatus 26 includes a carrier mechanism 36 and a guide mechanism 38. The holder body 18 of the sample cartridge holder 12A is to be inserted into the guide mechanism 38. Thus, the portion of the sample cartridge holder 12A to be inserted corresponds to the holder body 18. With the holder body 18 in the inserted state, the refrigerant tank 20 is located outside the guide mechanism 38.

The guide mechanism 38 holds the holder body 18, and also allows the holder body 18 to create a linear motion and a rotating motion during insertion or extraction of the holder body 18. The carrier mechanism 36 is a mechanism that carries a carrier base holding the sample cartridge, as will be described below. The sample cartridge carrier apparatus 26 includes the sub cooling equipment having a refrigerant tank 39 containing liquid nitrogen, for example. In FIG. 2, the main cooling equipment of the FIB processing apparatus 24 is omitted.

The sample cartridge carrier apparatus 26 includes equipment to apply coating to an unprocessed sample and equipment to apply coating to a processed sample.

In the drawings, the direction indicated with X corresponds to a first horizontal direction, the direction indicated with Y corresponds to a second horizontal direction, and the direction indicated with Z corresponds to a vertical direction. These three directions are mutually orthogonal to each other. The holder body 18 of the sample cartridge holder 12A is inserted along the X direction. The carrier base is carried by the carrier mechanism 36 along the Y direction. The insertion direction of the holder body 18 and the carrying direction of the carrier base are thus orthogonal to each other, which prevents physical interference of the carrier mechanism 36 and the guide mechanism 38 and also simplifies the configuration of the sample cartridge carrier apparatus 26.

Figure 3:
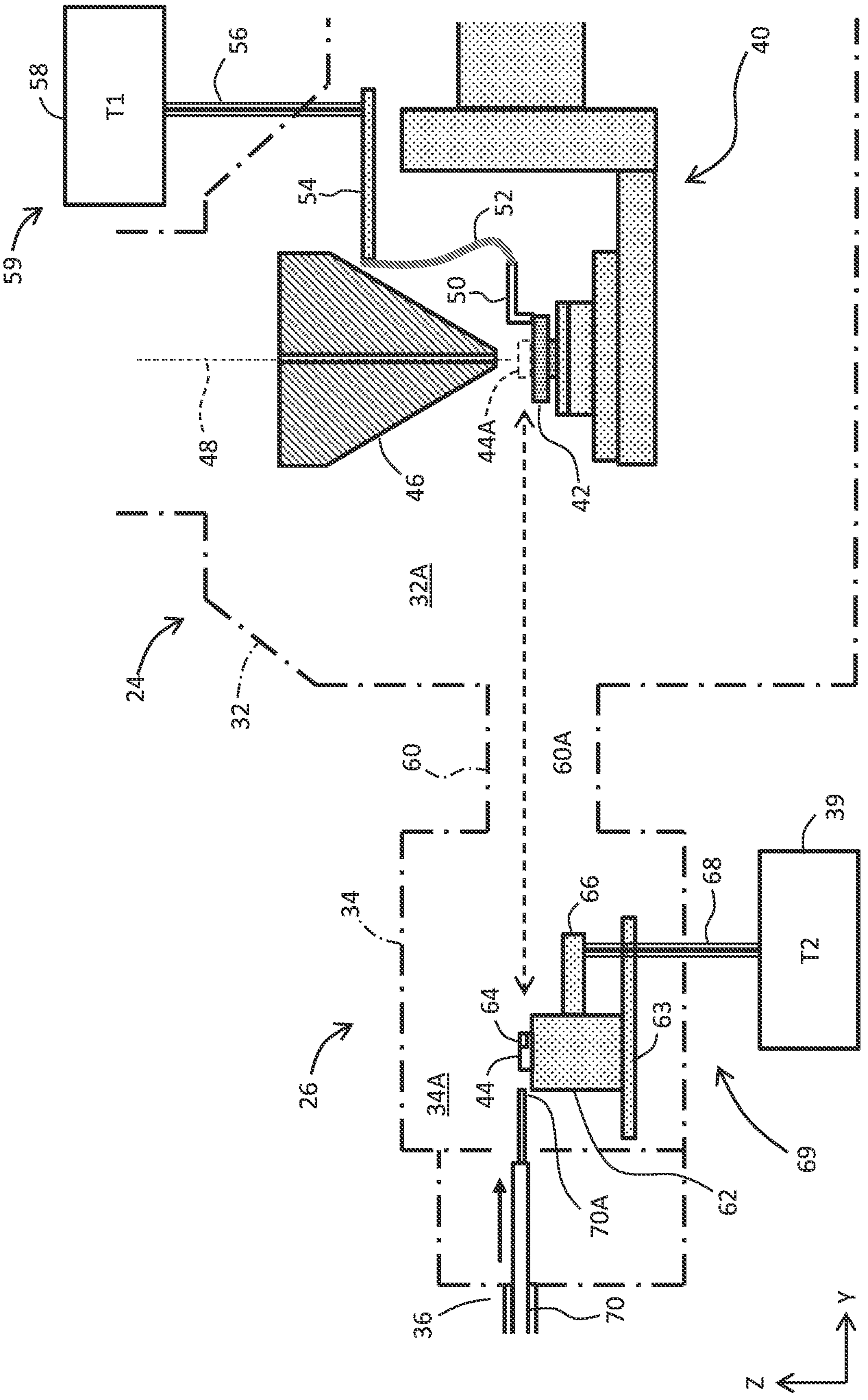
FIG. 3 is a cross sectional view schematically illustrating an FIB processing system according to an embodiment.

FIG. 3 schematically illustrates a cross section of the processing system. The FIB processing apparatus 24 includes the first chamber 32A or a vacuum sample chamber within the housing 32. The first chamber 32A includes a main stage 40 on which the carrier base is to be set. Specifically, a carrier base 44A is to be placed on a table 42 of the main stage 40. The main stage 40 includes a tilt mechanism, an elevator mechanism (Z mechanism), and an XY mechanism, and a rotation mechanism, for example. The main stage 40 changes the position and orientation of a sample.

The first chamber 32A includes an SEM objective lens 46. During sample observation, the sample is irradiated with an electron beam 48. The first chamber 32A further includes an FIB objective lens which is not shown in FIG. 3. A plurality of thermal links 50, 52, 54, and 56 are disposed between the table 42 and a refrigerant tank 58 containing liquid nitrogen, for example. Each of the thermal links 50, 54, and 56 is a thermally conductive rigid member, and the thermal link 52 is a thermally conductive flexible member. The thermal links 50, 52, 54, and 56, and the refrigerant tank 58, form the main cooling equipment 59.

The sample cartridge carrier apparatus 26 is coupled to a port 60 disposed on the housing 32. The port 60 includes a passage 60A therein, and the passage 60A may have a shutter.

The sample cartridge carrier apparatus 26 includes the second chamber 34A or a vacuum sample chamber within the housing 34. The second chamber 34A includes a base 63 on which a sub stage 62 is fixed. The sub stage 62 is an assembly of a plurality of metal members. The sub stage 62 has a top face or a mount face on which the carrier base 44 is placed. The carrier base 44 is a movable mount that retains the sample cartridge 64.

The carrier mechanism 36 carries the carrier base 44 between the sub stage 62 and the main stage 40 along the Y direction. The carrier mechanism 36 includes a rod 70 extending in the Y direction and having a tip end 70A configured to hold the carrier base 44 by various methods. The carrier base 44 itself has a portion to be held by the tip end 70A.

Thermal links 66 and 68 that are thermally conductive rigid members are disposed between the sub stage 62 and the refrigerant tank 39. The thermal links 66 and 68 and the refrigerant tank 39 form the sub cooling equipment 69. The sub cooling equipment 69 cools, via the sub stage 62 and the carrier base 44, the sample cartridge (particularly the sample), and maintains the cooled condition. The sub cooling equipment 69, which is independent of the main cooling equipment 59, for example, enables stable and efficient cooling of the sample.

Figure 4:
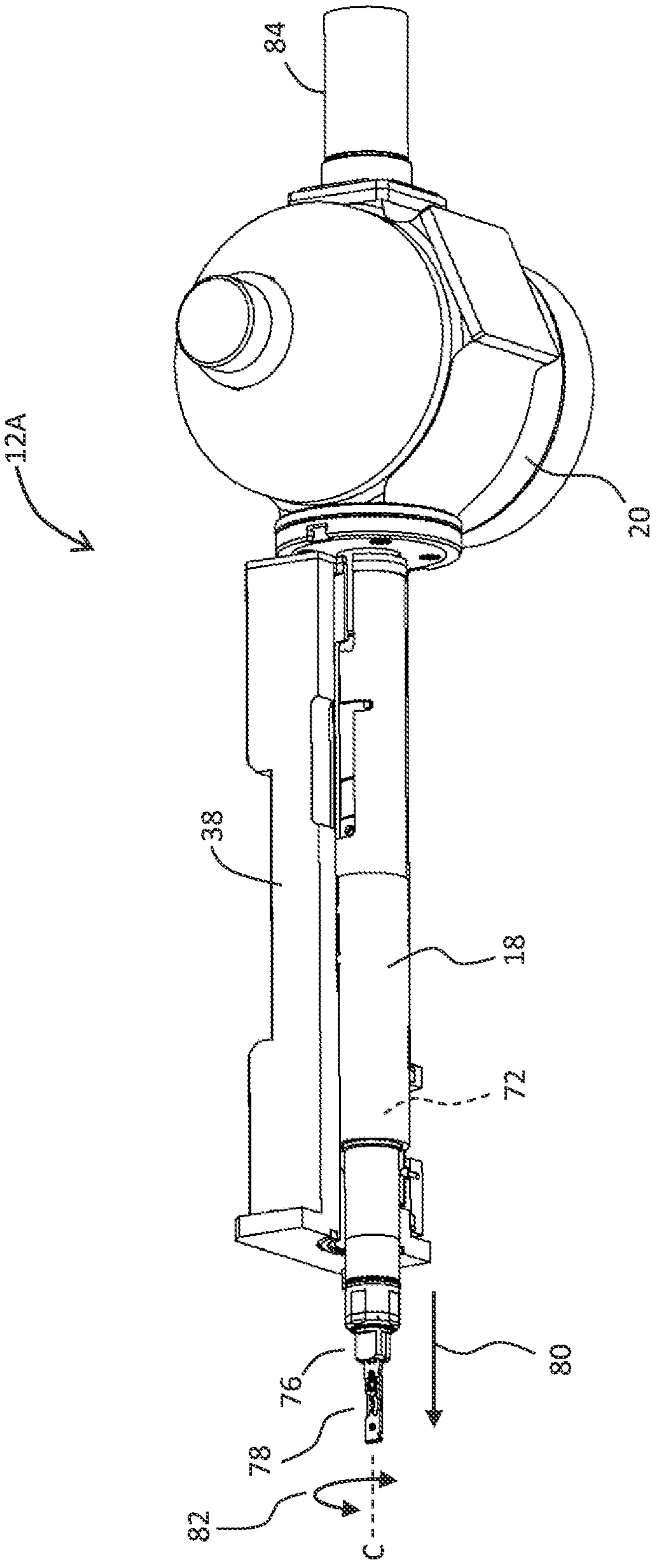
FIG. 4 is a perspective view illustrating a sample cartridge holder inserted into a guide mechanism.

FIG. 4 illustrates the sample cartridge holder 12A inserted in the guide mechanism 38, and schematically illustrates a section of the guide mechanism 38. The sample cartridge holder 12A is a portable device configured to manually transport the sample cartridge 78. The sample cartridge holder 12A includes the rod-like holder body 18, the refrigerant tank 20, and a grip 84. The holder body 18 includes a slide assembly 72 slidable along a center axis C. The slide assembly 72 has a tip end that holds the sample cartridge 78. FIG. 4 indicates the sliding direction 80 and the rotation direction 82.

The holder body 18 includes a pin on its outer surface and the guide mechanism 38 includes a slot having a predetermined shape on its inner surface. The sample cartridge holder 12A is manipulated to enable the pin to move along the slot, as will be described in detail below.

Figure 5:
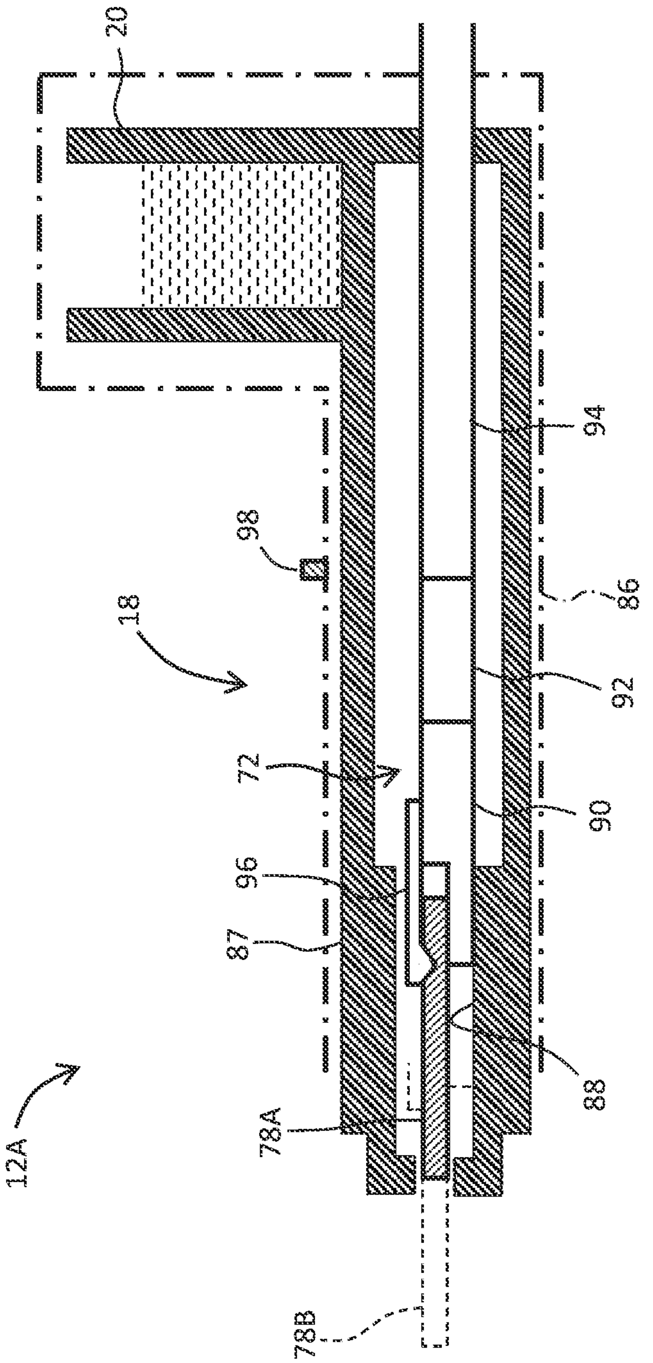
FIG. 5 is a cross sectional view schematically illustrating the sample cartridge holder.

FIG. 5 schematically illustrates a cross section of the sample cartridge holder 12A. FIG. 5 illustrates a cover member 86 and a thermally conductive member 87. The thermally conductive member 87 is coupled with a container of the refrigerant tank 20. The thermally conductive member 87 and the refrigerant tank 20 correspond to the portable cooling equipment. The holder body 18 houses the slide assembly 72 therein. In the illustrated example, the slide assembly 72 includes a tip end 90, a thermally insulating member 92, and a shaft 94. Operation of an end of the shaft 94 may allow the slide assembly 72 to slide.

The tip end 90 includes a hook 96 made of a leaf spring to detachably retain a proximal end of the sample cartridge 78A. As indicated by reference numeral 88, the tip end 90 is continuously in contact with the thermally conductive member 87. The sample cartridge protrudes forward as indicated by reference numeral 78B with the forward movement of the slide assembly 72. During the process of inserting the body 18 into the guide mechanism 38, and specifically before insertion, during insertion, or after insertion, the slide assembly 72 is pushed forward. During the process of extracting the body 18 from the guide mechanism 38, and specifically before extraction, during extraction, or after extraction, the slide assembly 72 is retracted backward.

The cover member 86 includes a pin 98 on its outer surface. The pin 98 moves within the slot formed on the inner surface of the guide mechanism 38. During the insertion operation, the sample cartridge holder 12A is inserted to allow the pin to move along the shape of the slot. Similarly, during the extraction operation, the sample cartridge holder 12A is extracted to allow the pin to move along the shape of the slot.

Figure 6:
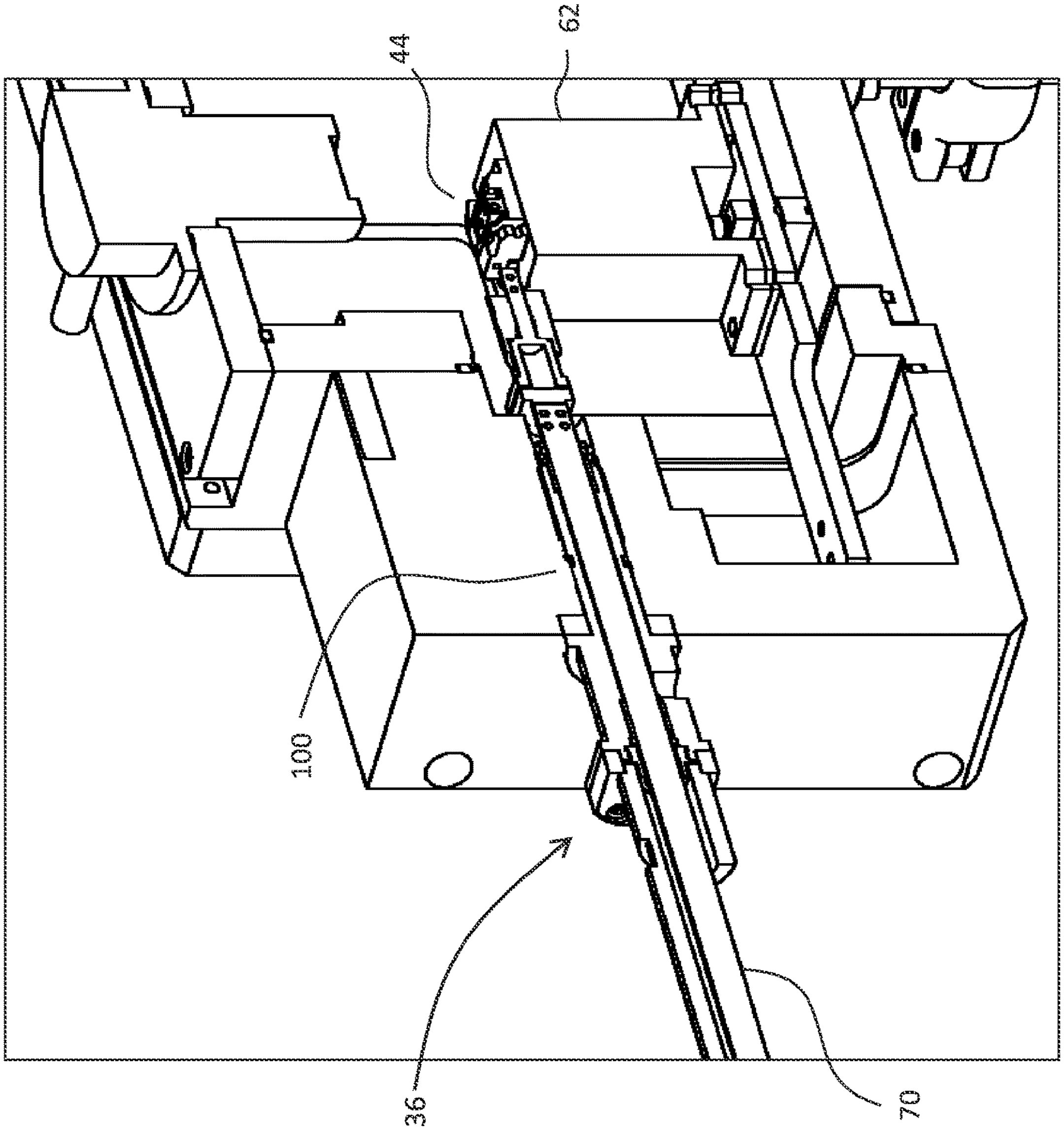
FIG. 6 is a cross sectional view illustrating part of a carrier mechanism.

FIG. 6 partially illustrates the carrier mechanism 36. In FIG. 6, the sub stage 62 is disposed within the second chamber, and the carrier base 44 is placed on the top face of the sub stage 62. The carrier base 44 holding the sample cartridge is carried by the carrier mechanism 36. The carrier mechanism 36 includes the rod 70 as described above, and advancing and retracting movements of the rod 70 are guided by a guide unit 100. The rod 70 may be operated by the user or mechanically driven by a driving mechanism.

Figure 7:
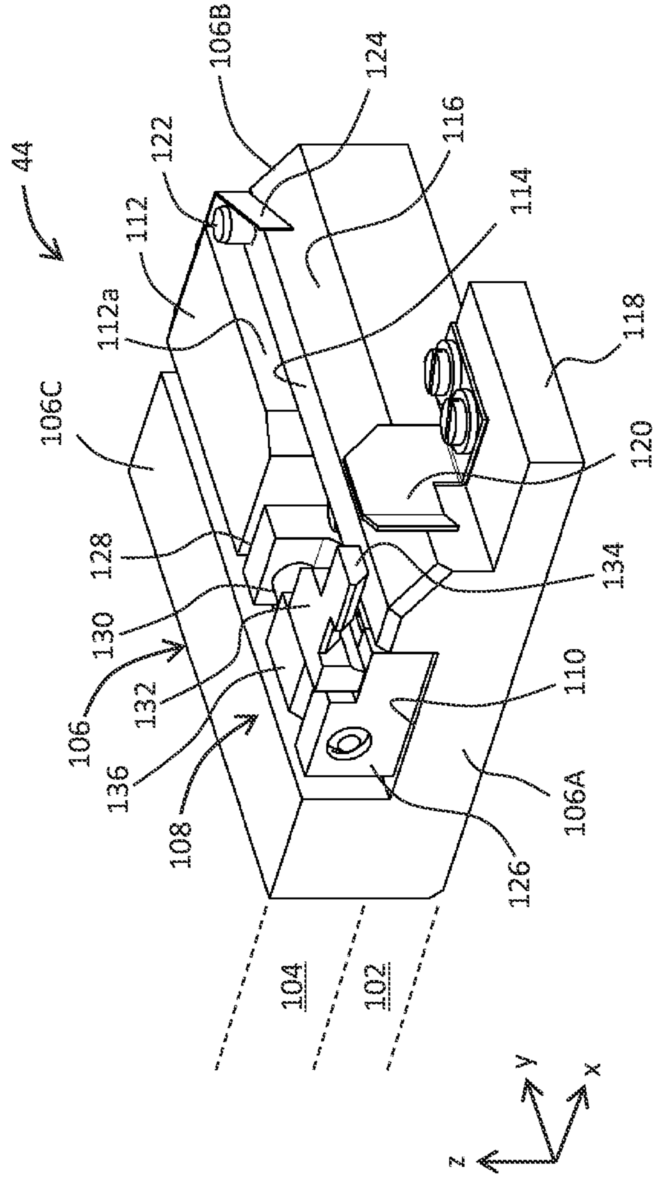
FIG. 7 is a perspective view illustrating a carrier base.

FIG. 7 illustrates the carrier base 44 according to the embodiment. In FIG. 7, the x direction corresponds to the X direction, the y direction corresponds to the Y direction, and the z direction corresponds to the Z direction. The carrier base 44 has a size of 3 mm×3 mm×1 mm, for example.

The carrier base 44 includes a cooler block 106 and a retainer mechanism 108. The cooler block 106 corresponds to a carrier base body made of a single metal member such as copper. The bottom face of the cooler block 106 is joined to the mount face of the sub stage. Specifically, the carrier base 44 includes a base portion 106A and protrusion portions 106B and 106C continuous with the base portion 106A. The base portion 106A has a planer shape covering the entire lower part 102 of the carrier base 44. The protrusion portions 106B and 106C are located in an upper part 104 of the carrier base 44 and extend along the y direction.

A recess 110 is disposed between the protrusion portion 106B and the protrusion portion 106C. The bottom face of the recess 110 corresponds to the top face of the base portion 106A. The retainer mechanism 108 is housed in the recess 110. A plate 112 made of a metal such as copper or stainless steel is also housed in the recess 110.

The top face of the protrusion portion 106B forms a mount face 114. The protrusion portion 106B includes a slope face 116 adjacent to the mount face 114. The slope angle of the slope face 116 is 30 degrees, for example, with respect to the x axis. A pin 122 is disposed at the back end of the protrusion portion 106B, and more specifically, at the back end of the mount face 114. A spring piece 124 is also disposed at the back end of the protrusion portion 106B. The spring piece 124 is bent in its natural condition and is made of a material or alloy, for example, capable of being elastic at low temperatures. The base portion 106A includes a projection portion 118 to which a guide plate 120 standing along the Z direction is fixed. The guide plate 120 is formed of a metal, such as titanium.

The retainer mechanism 108 includes bearings 126 and 128, a shaft member 130, and a lever member 132 that are made of a metal, such as stainless steel. A lock mechanism, which will be described below, forms part of the retainer mechanism 108. Regarding holding of the sample cartridge, the mount face 114, the guide plate 120, and a vertical wall 112*a* of a plate 112 also form part of the retainer mechanism 108.

The bearings 126 and 128 are spaced from each other along the y direction and secured to the base portion 106A. The bearings 126 and 128 hold the shaft member 130. The lever member 132 includes a lever 134 and a proximal end 136. The lever 134 is a tip end that performs a rising motion and a falling motion. The proximal end 136 has a through hole extending in the y direction to allow the shaft member 130 to pass through. The lever member 132 is rotatable about the shaft member 130 and is slidable along the shaft member 130. The width of the allowable sliding motion is 1 mm, for example.

As will be described below, a series of movements of the sample cartridge causes the lever member 132 to rotate and slide. In other words, the lever member 132 is remotely operated, and this eliminates the need for a driving source on or near the carrier base 44.

As will be detailed below, the sample cartridge is sandwiched and thus retained between the mount face 114 and the lever 134. At this time, the function of the lock mechanism causes the lever 134 to create a retaining force, which retains the sample cartridge on the carrier base 44 and integrates the sample cartridge into the carrier base 44. This effectively prevents displacement or falling of the sample cartridge during carrying of the sample cartridge.

The sub cooling equipment cools the carrier base 44 via the sub stage 62, and thus cools the sample cartridge (particularly, the sample), retained on the carrier base 44, thereby maintaining the sample cooled condition. The cooler block 106 functions as a heat sink that accumulates cold energy to thereby maintain the sample cooled condition or prevent a temperature rise of the sample during delivery of the sample cartridge. The plate 112 and the retainer mechanism 108 also function as part of the heat sink.

Figure 8:
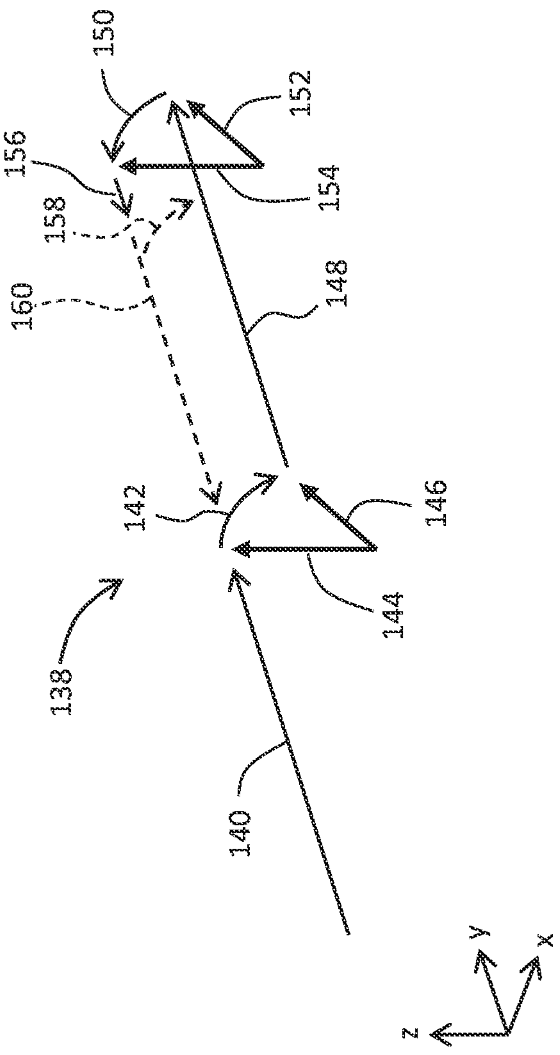
FIG. 8 schematically illustrates a series of movements of the sample cartridge.

FIG. 8 schematically illustrates a series of movements 138 of the sample cartridge holder, or a series of movements of the sample cartridge, during insertion of the sample cartridge holder into the guide mechanism.

The series of movements 138 includes, on a time sequence basis, a first forward movement 140, a positive rotation movement 142, a second forward movement 148, a counter rotation movement 150, and a backward movement 156. The positive rotation movement 142 changes the direction the top face of the sample cartridge faces, from a direction 144 to a direction 146. This change further changes the orientation of the sample cartridge from the horizontal orientation to the inclined orientation. During the second forward movement 148, the lever is placed in a rising or floating state, in which the projection of the sample cartridge passes immediately below the lever.

The counter rotation movement 150 changes the direction the top face of the sample cartridge faces, from a direction 152 to a direction 154. This change further changes the orientation of the sample cartridge from the inclined orientation to the horizontal orientation, which further causes the fallen state of the lever. The backward movement 156 then causes the protrusion of the sample cartridge to engage the lever. This operates the lock mechanism and also allows the sample cartridge to be removed from the sample cartridge holder.

Subsequently, the sample cartridge may be allowed to return along the same route in the opposite direction, as indicated by reference numeral 158, or may be allowed to linearly move backward as indicated by reference numeral 160. The shape of the slot on the guide mechanism may be determined to enable the lever, for example, to move as desired. To collect the sample cartridge having the processed sample, after the series of movements illustrated in FIG. 8 are sequentially performed, the series of movements are performed in the reverse order.

Specific example conditions in carrying the sample cartridge to the carrier base will be described.

Figure 9:
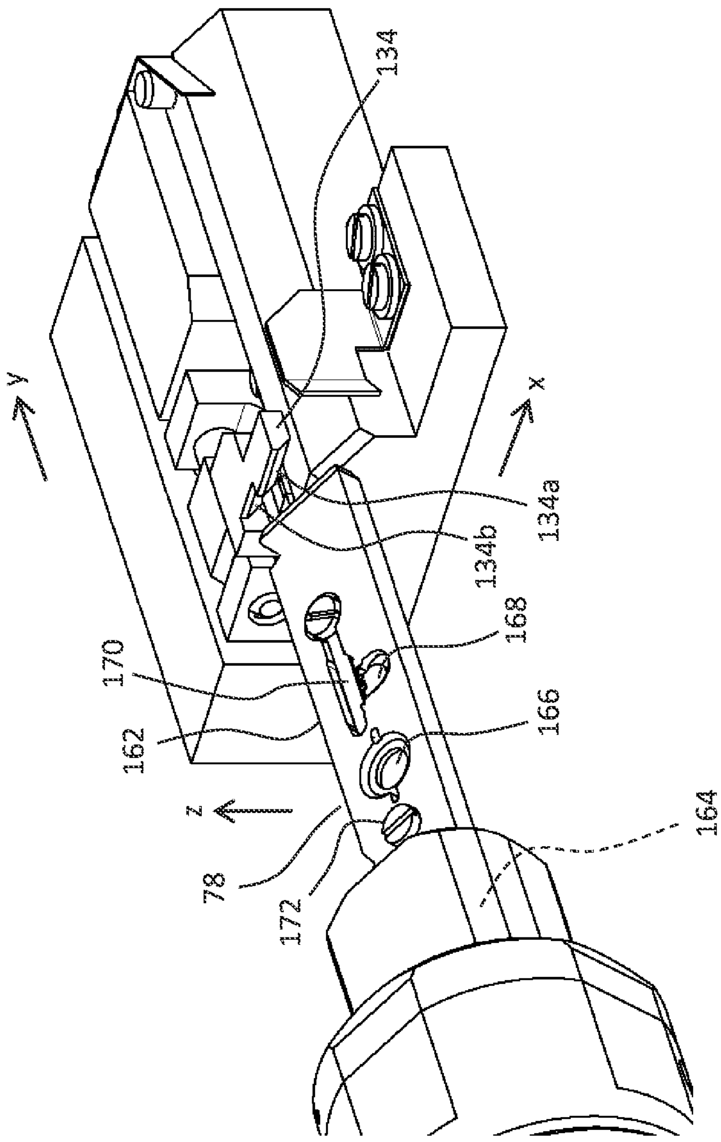
FIG. 9 illustrates a lever in a fallen state.

FIG. 9 indicates a first half of the second forward movement of a sample cartridge 78. The entire sample cartridge 78 has a plate-like shape and includes a body 162 and a rear end 164 that is held by a tip end of the sample cartridge holder (more specifically, a tip end of the slide assembly).

The cartridge body 162 includes a first portion 166 that stores and holds a carrier having an unprocessed sample and a second portion 168 that stores and holds a carrier having a processed sample. Neither carrier is shown in FIG. 9. A spring piece 170 is disposed to retain the carrier in the second portion 168. A similar retainer may also be disposed in the first portion 166. The cartridge body 162 includes, on its top face, a protrusion 172 formed of a screw. The tip end of the cartridge body 162 is chamfered.

In the carrier base, the lever 134 is in the fallen state or is located at the lowest level. The lever 134 includes, at its front end portion, tapered faces 134*a* and 134*b* or slope faces facing diagonally downward that are arranged along the x direction.

Figure 10:
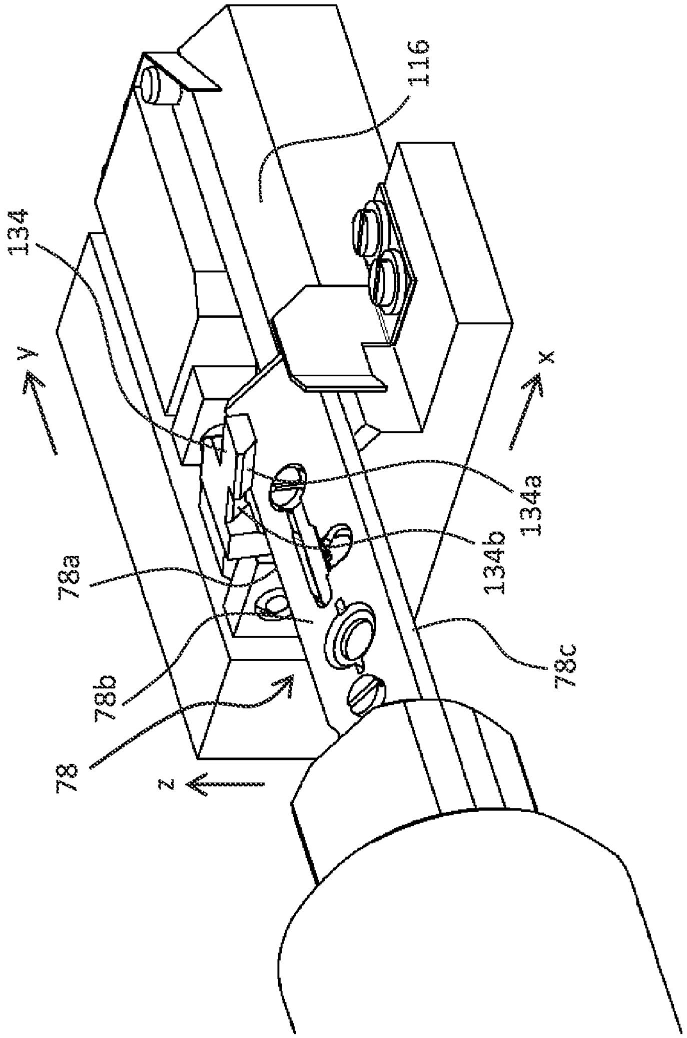
FIG. 10 illustrates a lever in a floating state.

FIG. 10 indicates a second half of the second forward movement of the sample cartridge 78. The forward movement of the sample cartridge 78 in the inclined orientation brings the tip end of the sample cartridge 78 into contact with the tapered face 134*a* or 134*b* of the lever 134 to thereby push the lever 134 upward, which places the lever 134 into a floating condition. The lever 134 is then supported by a specific corner portion 78*a* of the sample cartridge 78 and is thus maintained in the floating condition.

In the illustrated state, the top face 78*b* of the sample cartridge 78, except the specific corner portion 78*a*, is not in contact with the lever 134. The bottom face 78*c* of the sample cartridge 78 contacts the slope face 116, which guides the forward movement of the sample cartridge 78.

Figure 11:
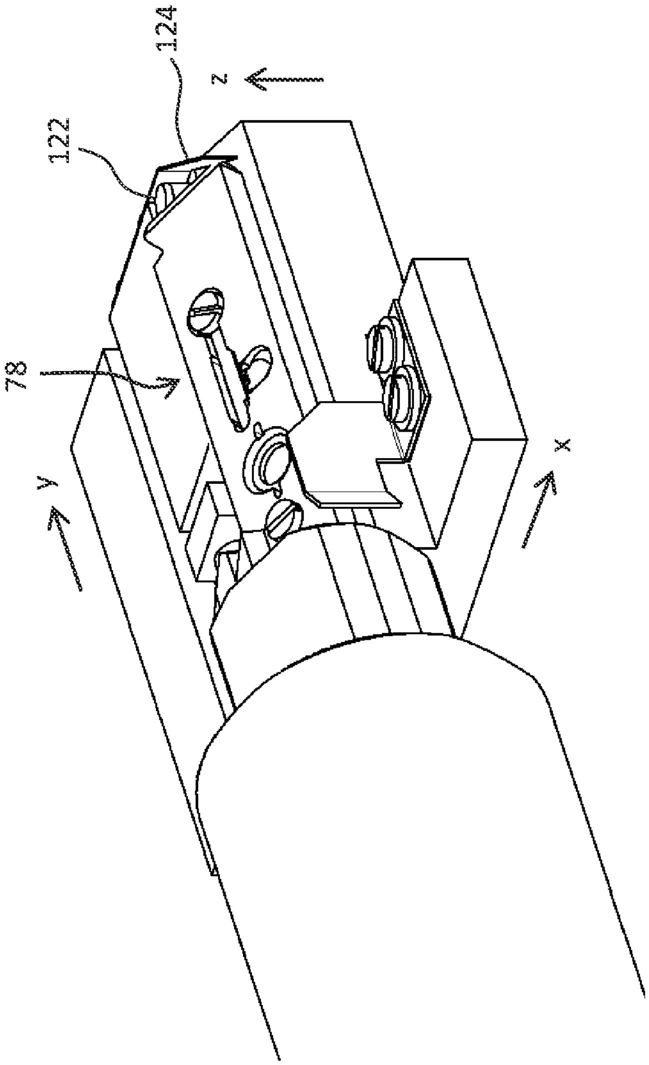
FIG. 11 illustrates the sample cartridge after the second forward movement.

FIG. 11 indicates the end of the second forward movement. The second forward movement terminates upon touching of the tip end face of the sample cartridge 78 with the pin 122. In this state, the spring piece 124 is pushed forward in the y direction and elastically deformed.

Figure 12:
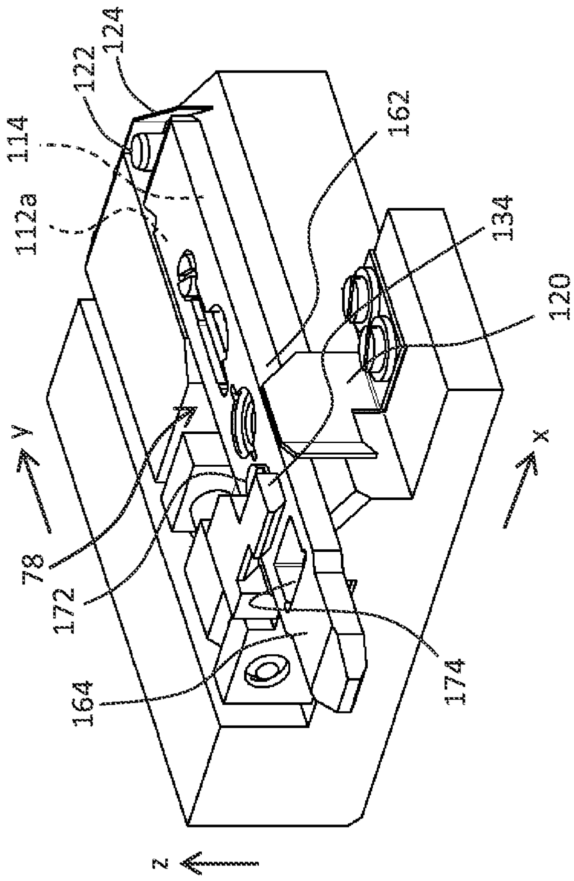
FIG. 12 illustrates a separated sample cartridge.

FIG. 12 illustrates the state immediately after start of the backward movement of the sample cartridge 78. The sample cartridge 78 returns to the horizontal orientation and the bottom face of the sample cartridge 78 is on the mount face 114. The lever 134 is in the fallen state in which the bottom face of the lever 134 is in contact with the top face of the cartridge body 162. Upon touching of the protrusion 172 with the lever 134, the sample cartridge 78 is removed from the sample cartridge holder. At the same time, the lock mechanism described below operates.

The vertical wall 112*a*, the guide plate 120, and the spring piece 124 restrict the movement of the sample cartridge 78 in the x direction. The pin 122 restricts the forward movement of the sample cartridge 78 in the y direction. Contact of the protrusion 172 with the lever 134 restricts the movement of the sample cartridge 78 backward in the y direction. The depression force of the lever 134 restricts the movement of the sample cartridge 78 in the z direction.

Figure 13:
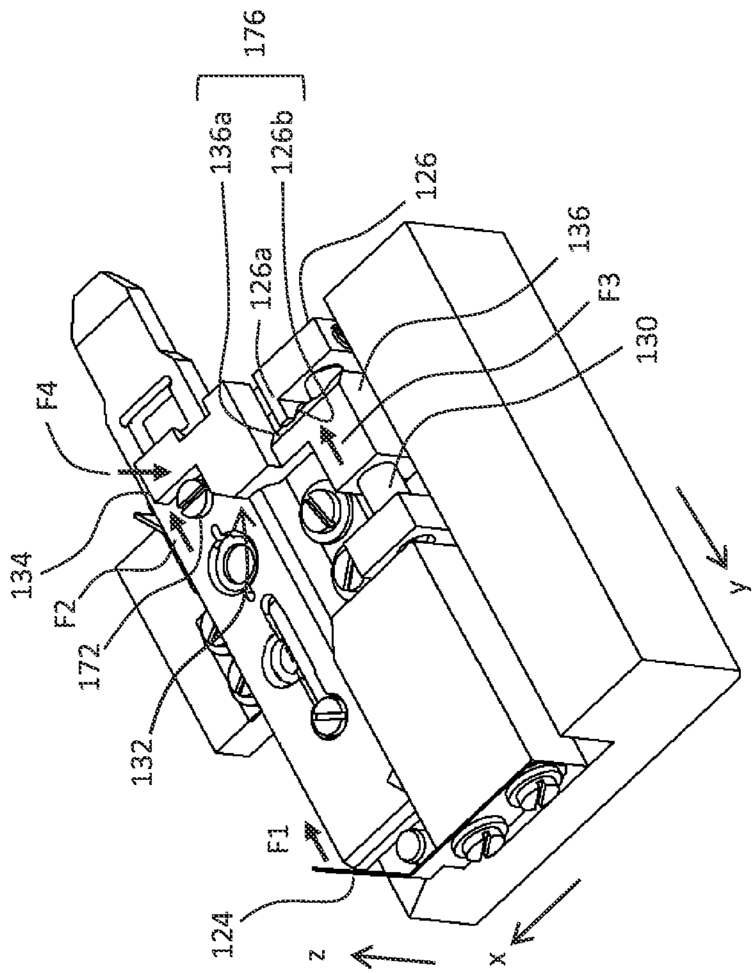
FIG. 13 illustrates a movement of a lock mechanism.

FIG. 13 further illustrates the state immediately after start of the backward movement of the sample cartridge 78. The protrusion 172 is in contact with the rear end of the lever 134. The shaft member 130 extends through the through hole in the proximal end 136 to enable the lever member 132 to be slidable in the y direction. The bearing 126 includes a hook 126*a* protruding forward in the y direction and having a slope face 126*b* or a face facing diagonally downward. The proximal end 136 has a slope face 136*a* or a face facing diagonally upward. Rearward sliding movement of the lever member 132 in the y direction brings the slope face 136*a* and the slope face 126*b* into contact with each other to yield a force restricting the rise of the lever 134 or a force pressing the lever 134 downward. The slope face 126*b* corresponds to a first engaging portion and the slope face 136*a* corresponds to a second engaging portion. The slope face 126*b* and the slope face 136*a* form the lock mechanism 176.

In summary, in the state illustrated in FIG. 13, the elastic force F1 generated by the spring piece 124 yields a force F2 of the protrusion 172 to urge the lever 134. This urging force F2 further yields a force F3 urging the lever member 132 rearward in the y direction. The urging force F3 then enables the lock mechanism 176 to operate to thereby yield a pressing force (restricting force) F4.

A combination of the spring piece 124 and the lock mechanism 176 enables stable holding of the sample cartridge, thereby effectively preventing the positional shift and falling of the sample cartridge during carrying of the sample cartridge, and thus protecting the sample. To remove the sample cartridge, the removing operation can be performed safely and appropriately. Any elastic member other than the spring piece 124 may be disposed, and the lock mechanism 176 may be any mechanisms other than that illustrated in FIG. 13.

Figure 14:
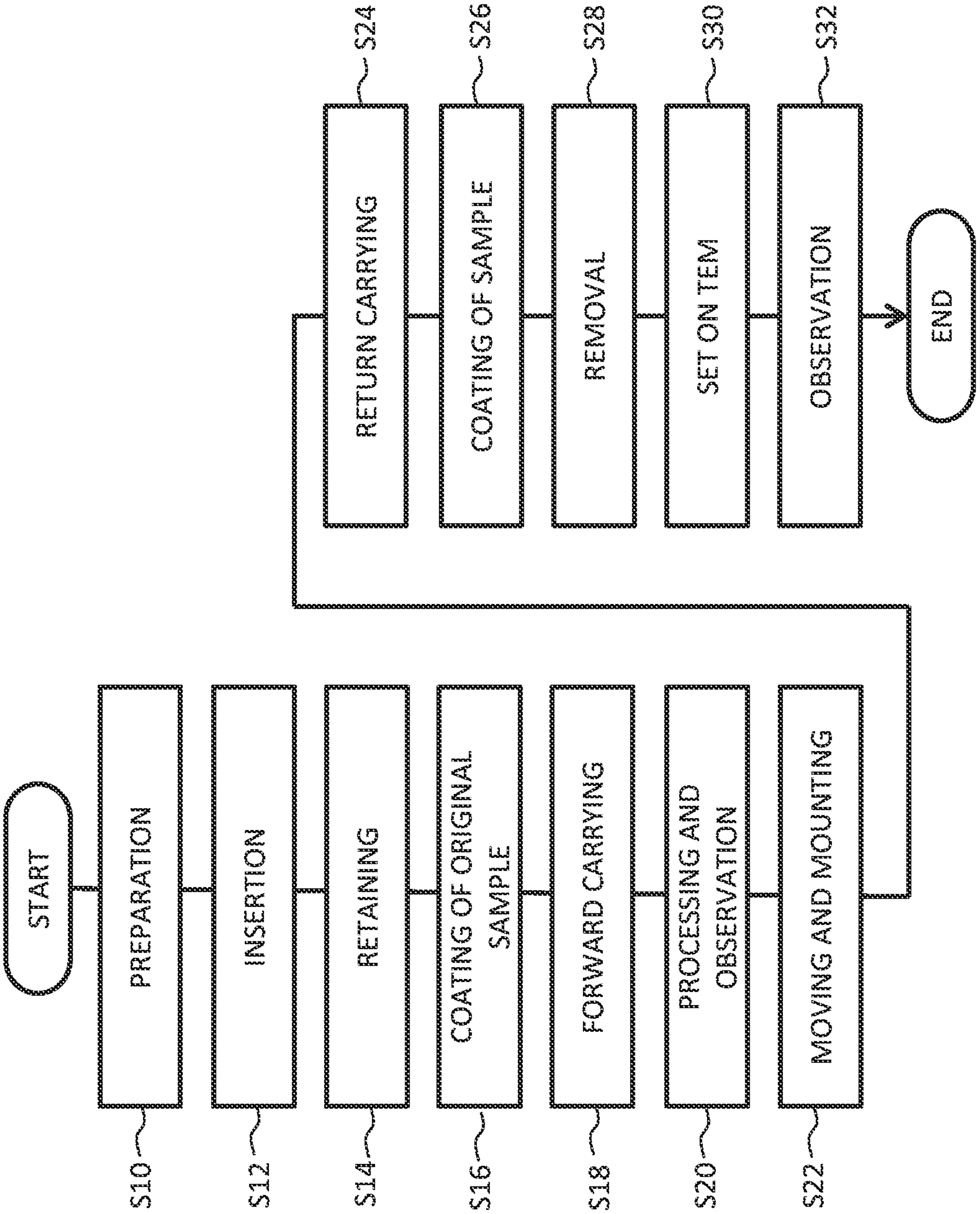
FIG. 14 is a flowchart showing a processing observation method.

FIG. 14 illustrates a flowchart for explaining a processing observation method to be performed with the processing observation system illustrated in FIG. 1. In step S10 which is a processing preparation step, an original sample, which is relatively large bulk sample, in a frozen condition is placed on a carrier, and the carrier is mounted on the sample cartridge. The sample cartridge is held by the sample cartridge holder. The processing preparation operation is performed within a tank containing liquid nitrogen.

In step S12, the holder body of the sample cartridge holder is inserted into the guide mechanism of the sample cartridge carrier apparatus. In step S14, the sample cartridge is retained on the carrier base. In step S16, a coating is applied to the original sample within the sample cartridge carrier apparatus. In step S18, the carrier mechanism carries the carrier base retaining the sample cartridge from the sub stage to the main stage.

In step S20, the FIB processing apparatus processes the sample, and the sample is observed at necessary times. In step S22, in the sample cartridge, the sample or a fine sample held on the carrier retained in the first portion is moved onto the carrier held in the second portion with a predetermined tool or a manipulator.

In step S24, the carrier mechanism carries the carrier base retaining the sample cartridge from the main stage to the sub stage. In step S26, a coating is applied to the processed sample.

In step S28, the sample cartridge is mounted on the sample cartridge holder, and then the sample cartridge holder is taken from the sample cartridge carrier apparatus. In S30, the sample cartridge holder is mounted on the transmission electron microscope. In step S32, the processed sample is observed with the transmission electron microscope.

The sample cartridge carrier apparatus according to the embodiment enables safe delivery of the sample cartridge, and particularly the sample. The sample cartridge carrier apparatus according to the embodiment further maintains the cooled condition of the sample or prevents a temperature rise of the sample during delivery of the sample cartridge. Further, the manual operation of the sample cartridge holder enables the retainer mechanism to operate, eliminating the need to dispose the driving source on or in the vicinity of the carrier base. Transfer of the sample cartridge between the sample cartridge holder and the carrier base requires no precise or complicated operations, which reduces the burden on users.

A driving mechanism may be disposed to enable the sample cartridge holder to perform the series of movements. If the sample does not need to be cooled, the sample cartridge carrier mechanism or the carrier base may be used as such a driving mechanism.

The invention claimed is:

1. A sample cartridge carrier apparatus comprising:

a sub stage disposed away from a main stage in a processing apparatus;

a carrier base configured to be placed on the sub stage, the carrier base comprising a cooler block and a retainer mechanism disposed in the cooler block, the retainer mechanism configured to retain a sample cartridge received from a sample cartridge holder;

sub cooling equipment configured to cool the cooler block via the sub stage; and a carrier mechanism configured to carry the carrier base that retains the sample cartridge between the sub stage and the main stage, wherein the processing apparatus comprises main cooling equipment configured to cool the main stage, the sample cartridge holder comprises portable cooling equipment configured to cool the sample cartridge, the portable cooling equipment being independent of the main cooling equipment, and the sub cooling equipment is independent of the main cooling equipment and the portable cooling equipment.

2. The sample cartridge carrier apparatus according to claim 1, wherein the sample cartridge holder is a portable device configured to guide an unprocessed sample to the sample cartridge carrier apparatus and deliver a processed sample from the sample cartridge carrier apparatus to an observation apparatus, and the sample cartridge carrier apparatus is coupled to a processing apparatus comprising the main stage.

3. The sample cartridge carrier apparatus according to claim 1, wherein the sample cartridge holder comprises a holder body having a tip end configured to hold the sample cartridge, and the sample cartridge carrier apparatus comprises a guide mechanism configured to receive the holder body and guide the tip end toward the carrier base.

4. The sample cartridge carrier apparatus according to claim 3, wherein the guide mechanism is configured to guide the holder body along a first direction, and the carrier mechanism is configured to carry the carrier base along a second direction orthogonal to the first direction.

5. A sample cartridge carrier apparatus comprising:

a sub stage disposed away from a main stage;

a carrier base configured to be placed on the sub stage, the carrier base comprising a cooler block configured to be cooled via the sub stage and a retainer mechanism disposed in the cooler block, the retainer mechanism configured to retain a sample cartridge received from a sample cartridge holder; and a carrier mechanism configured to carry the carrier base that retains the sample cartridge between the sub stage and the main stage, wherein the sample cartridge holder comprises a holder body having a tip end configured to hold the sample cartridge, the sample cartridge carrier apparatus comprises a guide mechanism configured to receive the holder body and guide the tip end toward the carrier base, the guide mechanism is configured to guide a series of movements of the holder body, the series of movements comprising a forward movement, a rotation movement, and a backward movement, and the retainer mechanism is configured to operate in accordance with a change in a position and orientation of the sample cartridge caused by the series of movements.

6. The sample cartridge carrier apparatus according to claim 5, wherein the sample cartridge comprises a cartridge body and a rear end that is continuous to the cartridge body, the retainer mechanism comprises a mount face and a lever member including a lever, the lever is sequentially placed in a floating state and a fallen state in accordance with a change in the position and orientation of the sample cartridge, in the floating state, the cartridge body passes under the lever, and in the fallen state, the sample cartridge is disposed between the mount face and the lever.

7. The sample cartridge carrier apparatus according to claim 6, wherein the cartridge body comprises a first portion configured to hold a first member including an unprocessed sample and a second portion configured to hold a second member including a processed sample, and the lever in the fallen state is configured to hold the rear end.

8. The sample cartridge carrier apparatus according to claim 6, wherein the forward movement comprises a first forward movement and a second forward movement, the rotation movement comprises a positive rotation movement and a counter rotation movement, the series of movements comprises, on a time sequence basis, the first forward movement, the positive rotation movement, the second forward movement, the counter rotation movement, and the backward movement, the sample cartridge is placed in an inclined orientation after the positive rotation movement;

during the second forward movement, a corner portion of the sample cartridge is brought into contact with the lever to place the lever in the floating state, and subsequently, a protrusion of the sample cartridge passes under the lever, after the counter rotation movement, the sample cartridge is placed in a horizontal orientation to bring a bottom face of the sample cartridge into contact with the mount face, and during the backward movement, the protrusion is brought into contact with the lever, allowing the sample cartridge to be removed from the tip end.

9. The sample cartridge carrier apparatus according to claim 8, wherein the carrier base comprises a slope face configured to guide a bottom face of the sample cartridge in the inclined orientation.

10. The sample cartridge carrier apparatus according to claim 6, wherein the retainer mechanism comprises:

a member configured to support the lever member to allow the lever member to rotate and move forward and backward; and a lock mechanism configured to restrict the rotation of the lever member, the lock mechanism comprising:

a first engagement portion; and a second engagement portion disposed on the lever member, the second engagement portion configured to engage the first engagement portion by the backward movement of the lever member with the lever being in the fallen state.

11. The sample cartridge carrier apparatus according to claim 10, wherein the retainer mechanism comprises an elastic member configured to impart a backward force to the sample cartridge.

12. A carrier base configured to be carried between a sub stage and a main stage, the carrier base comprising:

a retainer mechanism configured to retain a sample cartridge received from a sample cartridge holder, the sample cartridge comprising a cartridge body and a rear end that is continuous to the cartridge body, wherein the retainer mechanism comprises:

a mount face;

a lever member comprising a lever configured to rise and fall; and a lock mechanism configured to restrict rising of the lever, with the sample cartridge disposed between the mount face and the lever, wherein the lever is sequentially placed in a floating state and a fallen state in accordance with a change in a position and orientation of the sample cartridge, in the floating state, the cartridge body passes under the lever, and in the fallen state, the sample cartridge is disposed between the mount face and the lever.

* * * * *